United States Patent [19]
Saldin et al.

[11] Patent Number: 5,227,630
[45] Date of Patent: Jul. 13, 1993

[54] METHOD AND APPARATUS FOR IMAGING OF AN ATOMIC ENVIRONMENT

[75] Inventors: Dilano K. Saldin, Milwaukee; Brian P. Tonner, Shorewood; Gerald R. Harp, Milwaukee, all of Wis.

[73] Assignee: Board of Regents of the University of Wisconsin System, Milwaukee, Wis.

[21] Appl. No.: 570,278

[22] Filed: Aug. 20, 1990

[51] Int. Cl.$^5$ .................. G01N 23/22; G21K 7/00
[52] U.S. Cl. .................................. 250/307; 250/306; 378/43
[58] Field of Search ............. 359/1, 9, 29, 35, 558, 359/577, 900; 250/305, 306, 310, 311, 307; 378/43, 64, 74

[56] References Cited

U.S. PATENT DOCUMENTS 4,532,422  7/1985  Nomura et al. ............. 250/306
4,935,625  6/1990  Hasegawa et al. .......... 250/306

OTHER PUBLICATIONS

Heinz, K. et al. "Measurement of Diffuse LEED Intensities" *Surface Science* 173 (1986) pp. 366–378.
Barton, John J., "Photoelectron Holography" *Physical Review Letters*, vol. 61, No. 12, Sep. 19, 1988, pp. 1356–1359.
"Electron Holography of Surfaces", J. B. Pendry, *Physics World* (Jul. 1990) pp. 21–22.
"Holographic LEED," D. K. Saldin and P. L. de Andres, *Phys. Rev. Lett.* vol. 64, No. 11 (Mar., 1990) pp. 1270–1273.
"Improvement of the Spherical Mirror Analyzer," H. Daimon and S. Ino, *Rev. Sci. Instrum.* 61 (1), Jan., 1990.
"Reliability of Diffuse LEED Intensity Measurements," Starke, et al., *Surface Science*, 216 (1989) pp. 325–342.
"New Display-Type Analyzer for the Energy and the Angular Distribution of Charged Particles," H. Daimon, *Rev. Sci. Instrum.* 59 (4), Apr. 1988 pp. 545–549.
"SEXAFS Without X-Rays," J. B. Pendry and D. K. Saldin, *Surface Science*, 145 (1984) pp. 33–47.
X-Ray And Electron Holography Using A Local Reference Beam, Szoke, *Short Wavelength Coherent Radiation: Generation And Application:* Monterey, Calif., 1986, Proceedings Of The Topical Meeting, On Short Wavelength Coherent Radiation: Generation And Applications, Edited By D. J. Atwood & Baker, AIP Conf. Proc. No. 147, pp. 361–367 [AIP N.Y.] (1986).

*Primary Examiner*—Bruce Y. Arnold
*Assistant Examiner*—David R. Parsons
*Attorney, Agent, or Firm*—Foley & Lardner

[57] ABSTRACT

A method and apparatus for imaging of an atomic environment are disclosed. The method includes detecting and measuring the intensity of a diffuse low energy electron diffraction pattern. The diffraction pattern may be formed by directing a beam of electrons against the surface of a sample, or by directing a beam of X-rays against the surface of a sample. The diffraction pattern may be energy-filtered to obtain a diffraction pattern corresponding to the lower energy electrons emitted by the surface. Data corresponding to reconstructed amplitudes of a waveform is generated by operating on the intensity data. The data corresponding to the reconstructed amplitude is capable of being displayed as a variety of slices or two-dimensional planes of the three-dimensional image of an atomic environment, and is capable of being displayed holographically.

31 Claims, 6 Drawing Sheets

METHOD AND APPARATUS FOR IMAGING OF AN ATOMIC ENVIRONMENT

FIELD OF THE INVENTION

This invention pertains generally to a method and apparatus for surface structure determination and in particular to a method and apparatus for surface structure determination from localized electron sources.

BACKGROUND OF THE INVENTION

The information pertaining to the relative positions of atoms near the surface of a sample is important in understanding the chemical and physical properties of surface structure. Techniques of gathering information concerning surface structure include localized source electron diffraction, such as photoelectron, Auger, and Kikuchi diffraction, low energy electron diffraction (LEED) and diffuse LEED (DLEED).

Reflected Kikuchi electrons are electrons that are back-scattered when an incident electron is directed at the surface of a sample and undergoes an inelastic collision within the sample before being scattered back out of the surface. Kikuchi electrons also typically undergo one or more elastic collisions before leaving the sample. Kikuchi electrons, whose inelastic collisions are due to thermal vibrations, have energies close to the energy of the incident electron beam because the inelastic collisions they undergo involve small energy losses.

Experiments involving Kikuchi electron diffraction patterns are generally conducted at room temperature or higher. These temperatures are necessary to provide sufficient thermal energy to cause the lattice atoms to vibrate significantly. The inelastic collision that creates a Kikuchi electron is a collision between an incident electron and a vibrating lattice atom.

Kikuchi diffraction patterns have been formed by directing a beam of incident electrons onto the surface of a sample. The intensity distribution of the diffraction pattern conveys information regarding the bonding angles of the lattice structure of the surface of the sample.

Auger electrons are also used to study lattice structures. Auger electrons are formed by a three step process involving several electrons. An incident electron strikes a "target" lattice atom and knocks an electron out of a state near the core of the target atom. The resulting core-hole is then filled by a higher energy electron near the target atom, which emits energy corresponding to the potential difference between its initial and final states. This energy is absorbed by another nearby electron, known as an Auger electron, and causes the Auger electron to be emitted from the sample.

Both Kikuchi and Auger electrons have effectively localized sources. A localized source electron is an electron that either appears to, or actually does, originate near an atomic nucleus within the sample. A Kikuchi electron is a localized source electron because phase information is lost when the electron undergoes an inelastic collision. When the phase information is lost the electron is no longer coherent with other such electrons and appears to have originated from within the sample. An Auger electron is a localized source electron because the Auger electron is not coherent with other Auger electrons.

In order to obtain three dimensional information regarding lattice structure it has been suggested to use holograms and holographic techniques (the creation of a three dimensional image from an interference pattern). A hologram is a record of an interference pattern, which, when properly illuminated, forms a three dimensional image of the object originally used to create the interference pattern. Thus, assuming that it is possible to create one, a hologram of a surface may be used to determine the relative positions of the atoms near the surface of the sample.

A hologram of an object is created by simultaneously irradiating photographic film and the object with coherent light. Light that is reflected off of the object, called the object wave, travels to the film and forms an interference pattern with the mutually coherent light that travels directly to the film (called the reference wave). When the recorded interference pattern, or hologram, is illuminated by a coherent reconstructing wave identical to the reference wave, a portion of the transmitted light (wave pattern) is identical to the light (wave pattern) that was reflected off of the object and used to create the hologram. Since this part of the transmitted wave pattern is identical to the original wave pattern, an observer at any location sees a three dimensional image of the object, just as the original object would have been seen from that location.

Electron holography is similar to conventional holography, except that the waves used to create the interference pattern are electrons. As is well known to those skilled in the art, electrons that are monochromatic (i.e. electrons that have the same energy), and that travel in the same direction (i.e. parallel to one another) may be treated as coherent waves according to theory of quantum mechanics. As the electrons become less monochromatic and/or the direction of travel of individual electrons diverges, the electron beam becomes less coherent. Thus, when electrons having an appropriate uniformity of energy and direction of travel to be considered coherent waves over the distance travelled from the object to the holographic film are utilized, a recorded interference pattern between an electron reference wave and an electron object wave form a hologram. The hologram, when illuminated by a reconstructing electron wave identical to the reference wave, should produce a three dimensional image.

The use of electron holography to gather information concerning surface structure promises to be a great advance in the art. It has been suggested, for example, that, an electron hologram can be created by recording the intensity of an interference pattern formed by electrons which are emitted from an adsorbed atom, and travel to the film directly from the adsorbed atom (the reference wave), or after scattering off of one or more nearby substrate atoms (the object wave). Then, rather than physically illuminating the hologram to reconstruct the image, data corresponding to the reconstructed intensity is generated by multiplying the recorded data by a function representing the intensity of a reconstructing wave, i.e. "mathematically" illuminating the hologram to reconstruct a real image. The image intensity at points off the hologram, i.e. a reconstructed image, may then be appropriately determined via a computer using certain mathematical techniques.

One method of using holographic techniques to determine surface structure is set forth in *Photoelectron Holography*. Vol. 61, No. 12, Phys. Rev. Letters, Sep. 19, 1988, by John Barton, which proposed to interpret photoelectron (PhD) data, collected on a portion of a spherical surface centered about a crystal having adsorbed atoms, as a photoelectron hologram. It was suggested that the photoelectron data may be normalized by subtracting from each intensity data point the intensity of the reference wave, and then dividing this difference by the square root of the intensity of the reference wave. Next, the normalized data, which corresponds to the intensity of a hologram (film), is then multiplied by a function representing a reconstructing wave, which is the conjugate of the reference wave, in this case a converging spherical wave. The resultant data corresponds to the transmitted intensity of an illuminating wave. The intensity at points off of the hologram (the spherical surface) is calculated using a mathematical technique called the Helmholtz-Kirchoff integral.

The Helmholtz-Kirchoff integral is a well known technique of determining the intensity of light in three dimensions given the intensity on a surface, and is particularly useful in PhD applications. According to the Helmholtz-Kirchoff integral, each point on the surface is treated as a point source of light, and a mathematical expression for the intensity in three dimensions due to each individual point source is determined. A mathematical expression for the total intensity in three dimensions is simply the sum of the amplitudes due to the point sources, and may be found by integrating the function representing the amplitudes due to the individual point sources over the surface (i.e. the point sources). The Helmholtz-Kirchoff integral, when applied to PhD holographic data, is in the form of a double Fourier integral, and may be solved numerically using a fast Fourier transform.

Another method of obtaining surface structure information is a technique of using low energy electrons to form a diffraction pattern (LEED). LEED involves scattering approximately 20–500 eV electrons off of a crystalline structure, thereby forming a diffraction pattern comprised of Bragg spots (i.e., concentrated high intensity areas) with low intensity areas between. The low energy ensures that the electrons penetrate only a few atomic layers of the substrate.

Experiments involving LEED have been used to determine surface structure. For example, using LEED with crystals assumed to have perfect order (i.e. no adsorbed atoms assumed with the crystal being periodic in all directions), the relative intensities of the various Bragg beams are measured, from which surface structure information is calculated. When partial disorder is assumed, i.e., when the surface is periodic in at least one direction and non-periodic in at least one direction, the disorder is reflected in and calculated from the intensity distributions within a Bragg beam (beam profiles).

Other prior art methods utilize diffuse LEED (DLEED) intensities (the intensities between Bragg beams) to determine surface structure of crystals having no long range order, such as a crystal having adsorbed atoms located randomly throughout the surface, though with locally identical environments as is often the case. For example, *Measurement of Diffuse LEED Intensities,* Surface Science Vol. 173, No. 2-3, pp. 366-378, Heinz et al., describes a method to determine the local environment of the adsorbed atoms. Such method includes the repetitive measurement of diffuse LEED intensities from crystals having adsorbed atoms and then calculating a smoothed spatial diffuse intensity distribution. The experimentally obtained distribution is then compared to computer generated distributions based on model crystal surface structures. When a computer generated distribution corresponds closely to the experimentally obtained distribution the conclusion is drawn that the surface structure of the experimental crystal is closely related to that model surface structure.

One overwhelming disadvantage of the prior art DLEED technique is that generation of the theoretical data is too time consuming to be performed concurrently with the experiment, but rather requires hours of super computer CPU time. The significant time involved in making the calculations and high cost of using super computer time presently makes it expensive and inefficient to use DLEED for gathering information concerning surface structure of crystalline material. Another disadvantage of all DLEED experiments is that they must be conducted at extremely low temperatures, near 77K. Finally, both DLEED and LEED techniques are directed to determining the local environment of an adsorbed atom, not a substrate atom.

Accordingly, a practical and inexpensive method and apparatus of determining the surface structure of ordered atoms near the surface of a sample which is capable of conveying the structure as the experiment is being performed is highly desirable. Furthermore, such a system would preferably be one which utilizes a source of electrons readily available in most laboratories, and be capable of being performed at room temperature.

SUMMARY OF THE INVENTION

A method of three-dimensional imaging of the atomic environment of atoms near the surface of the sample in accordance with one embodiment of the present invention comprises the initial step of forming a localized source electron diffraction pattern. The intensity of the distribution of the pattern is then detected and data corresponding to the intensity distribution is generated. Data corresponding to reconstructed amplitudes of a wave form is generated by operating upon the intensity data by a function representing a reconstructing wave. Data corresponding to an integral of the reconstructed wave-form is generated which is capable of being displayed as a three dimensional image of the atomic neighbors of the atomic source.

In accordance with another embodiment of the present invention, an apparatus for the reconstruction of a holographic image of atoms near the surface of a sample is provided comprising a source for generating a beam of electrons and directing the beam onto the surface of the sample, and generating local source electrons. Also included is a detector for detecting the intensity distribution of a diffraction pattern and a device responsive to the intensity distribution for generating a first information signal corresponding to the distribution and representing a reconstructed amplitude of a waveform. Still another device responsive to the first signal for generating a second signal capable of being converted into a three-dimensional image of the atomic environment of atoms near the surface of a sample is provided.

DETAILED DESCRIPTION OF THE PREFERRED EXEMPLARY EMBODIMENT

The present invention involves both a method and apparatus for determining the relative positions of atoms near the surface of a sample from data obtained using diffraction patterns formed from localized electron sources. According to the present invention, the diffraction pattern is recorded and treated as a hologram. Holographic image intensity data are generated from the hologram by a system which mimics the physical steps ordinarily necessary to create an actual image of the hologram. Selected planes of the generated image may be viewed by displaying data corresponding to a single plane on a television monitor or similar device. Alternatively, perspective views of the three-dimensional image may be generated and displayed.

Localized source electrons are incoherent electrons emanating from a sample. The localized source electrons may be formed by directing an electron beam onto the surface of the sample or by directing X-Rays onto the surface. When the incident electrons undergo an inelastic collision they lose their phase information and become incoherent Kikuchi electrons. Alternatively, the incident electrons may cause Auger electrons to be emitted by the sample. Since Auger electrons do not all originate at the same time, Auger electrons may be regarded as incoherent with each other. Similarly, X-rays incident upon the surface of the sample cause photoelectrons to be emitted.

Figure 1:
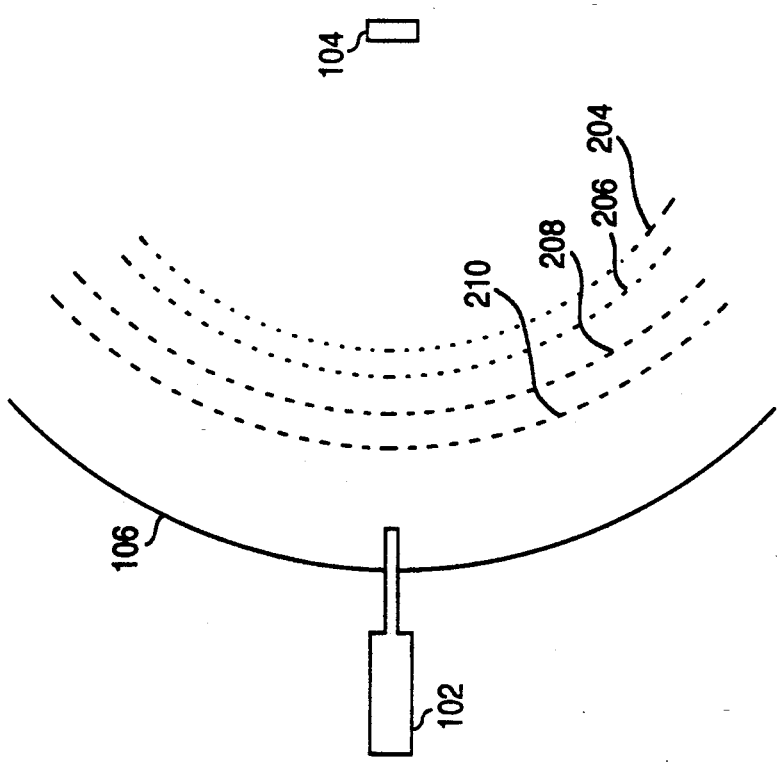
FIG. 1 depicts a schematic of an apparatus for determining the surface structure of a sample from Kikuchi electron diffraction data according to the present invention.
Figure 1:
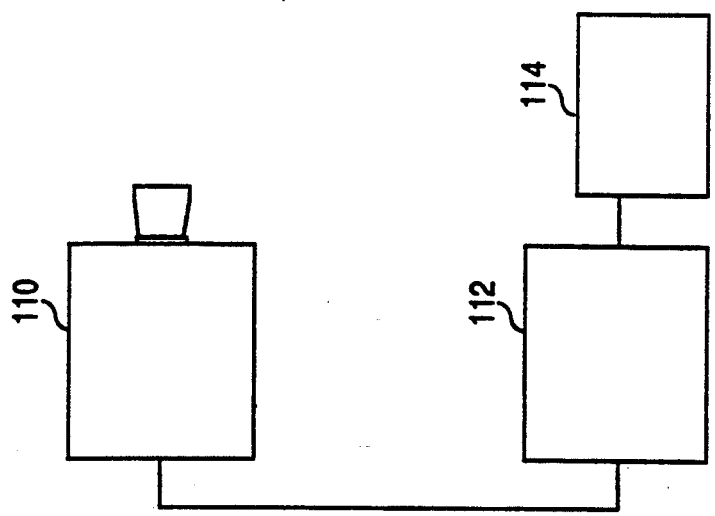

The preferred exemplary embodiment is directed primarily to diffraction patterns formed by Kikuchi electrons. However, the techniques and apparatus described are equally applicable to other localized source electrons. The equipment appropriate for generating and collecting Kikuchi electron diffraction data for the present invention is similar to equipment employed by conventional electron diffraction techniques used for gathering information about the surface structure of a sample, and includes, as shown in FIG. 1, an electron source 102 for directing electrons to a sample 104, a detector 106 for detecting the intensity of scattered electrons, a camera 110 for converting the intensity of the diffraction pattern of the electrons detected by detector 106 into electronic data, a computer 112 for storing and manipulating the data, a video display unit 114 for displaying a section of a selected plane of the resultant holographic image as the experiment is being conducted and an energy filter, comprised of grids 204–208, to allow only quasi-elastic electrons to reach the detector. As in conventional electron diffraction techniques, the data must be gathered in vacuum conditions.

To create the hologram, the electrons which are incident the surface of sample 104, should be sufficiently monochromatic and collinear. Thus, electron source 102, suitably an electron gun in the preferred exemplary embodiment, must be capable of emitting substantially monochromatic electrons and must collimate the electron beam such that the electrons travel from electron source 102 to the surface of sample target 104 along substantially parallel paths, such as a plurality of paths 302A, 303A, 304A, 305A and 306A, shown in FIG. 3. Using techniques well known in the art it is possible to provide an electron beam having an energy between 500 and 1100 eV that causes quasi-elastic (Kikuchi) electrons to be emitted. Similarly, an electron beam may be directed to the surface to create Auger electrons.

The quasi-elastic electrons originate from a localized source and are diffracted by the atoms near the surface of the sample and form an interference pattern at detector 106. As will be explained below, even though the different localized source electrons are incoherent, the diffraction pattern they form contains holographic data.

Figure 2:
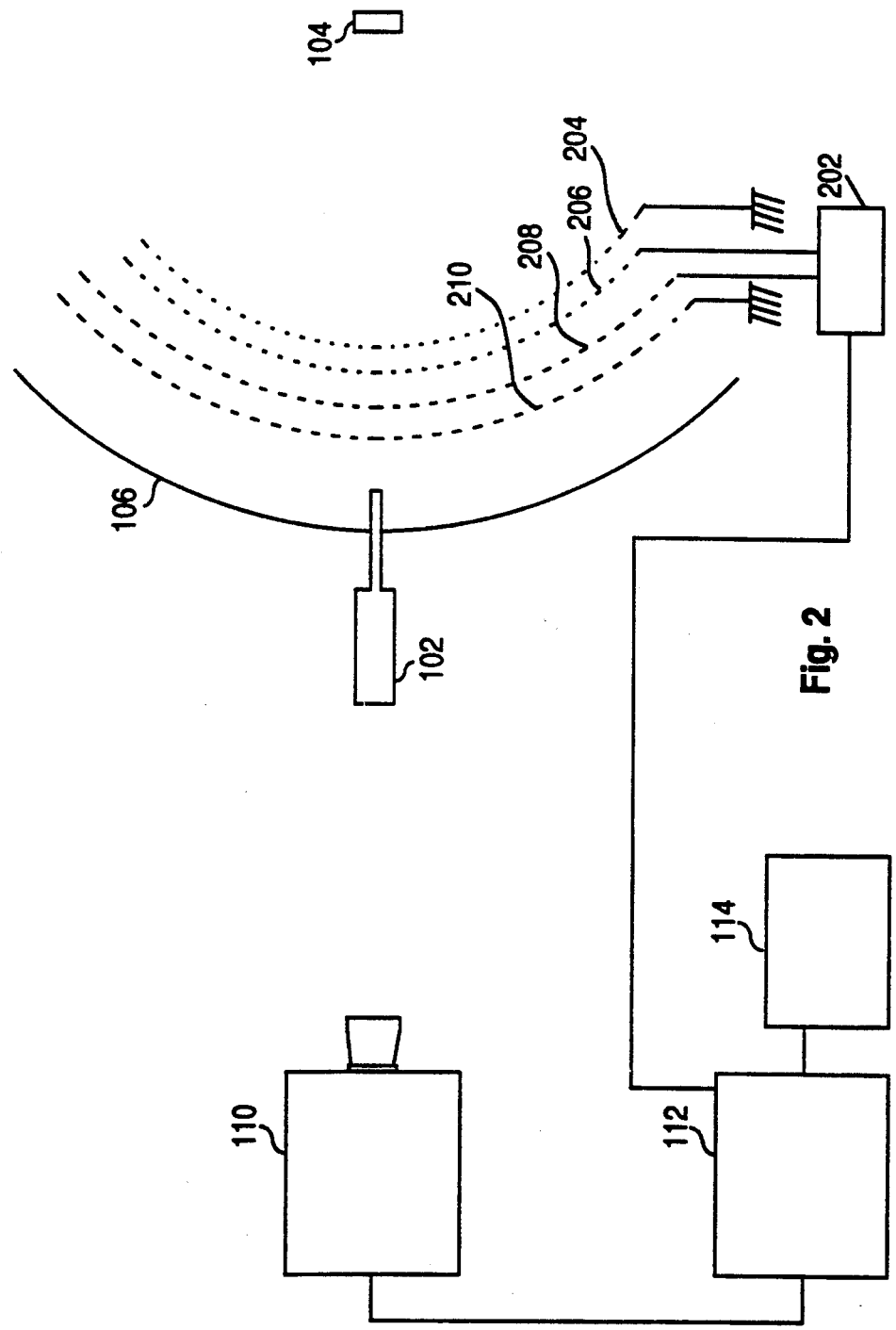
FIG. 2 depicts a schematic of an apparatus for determining the surface structure of a sample from Auger electron diffraction data according to the present invention.

Referring to FIG. 2, equipment for collecting Auger electron diffraction data for the present invention includes, as did the equipment to collect Kikuchi electron diffraction data, electron source 102, sample 104, detector 106, camera 110, computer 112 and video display unit 114. Furthermore, a modulator 202, cooperates with grids 204, 206, 208 and 210 to allow the lower energy Auger electrons to be detected.

Grids 204, 206, 208 and 210 along with modulator 202 form an energy filter to allow the detection of Auger electron diffraction patterns. Auger electrons, which have lower energy than Kikuchi electrons, are selectively filtered by the energy filter. Grids 204 and 210 are tied to ground and a voltage is selectively applied to grids 206, 208, in a manner well known in the art, to selectively prevent electrons having an energy lower than a predetermined level from passing through the grids. To obtain the Auger diffraction pattern, the modulator intermittently filters out the Auger electrons. The diffraction pattern formed without the Auger electrons is treated as background and subtracted from the diffraction pattern formed with the Auger electrons. The difference is the diffraction pattern of the Auger electrons.

In the preferred embodiment the grid is modulated at a frequency of 30 cycles per second. Thus, the two diffraction patterns are each formed every 1/30th of a second, and last for 1/60th of a second. The video camera provides a frame every 1/60th of a second, therefore one frame records the diffraction pattern with the Auger electrons, and the next frame records the diffraction pattern without the Auger electrons. The modulation frequency has been chosen for convenience, and, as one skilled in the art will recognize, may be varied.

The interference pattern (the hologram) formed at detector 106 is converted into electronic data by camera 110. When the electrons strike detector 106, which may, for example, be spherical in shape, detector 106 emits light, at the locations electrons impinge upon detector 106, of an intensity proportional to the number of electrons impinging at each location. Camera 110 converts the intensity pattern of the light emitted by detector 106 into electronic data. Computer 112 is suitably programmed to store and mathematically manipulate the electronic data which corresponds to the interference pattern intensity.

Figure 3:
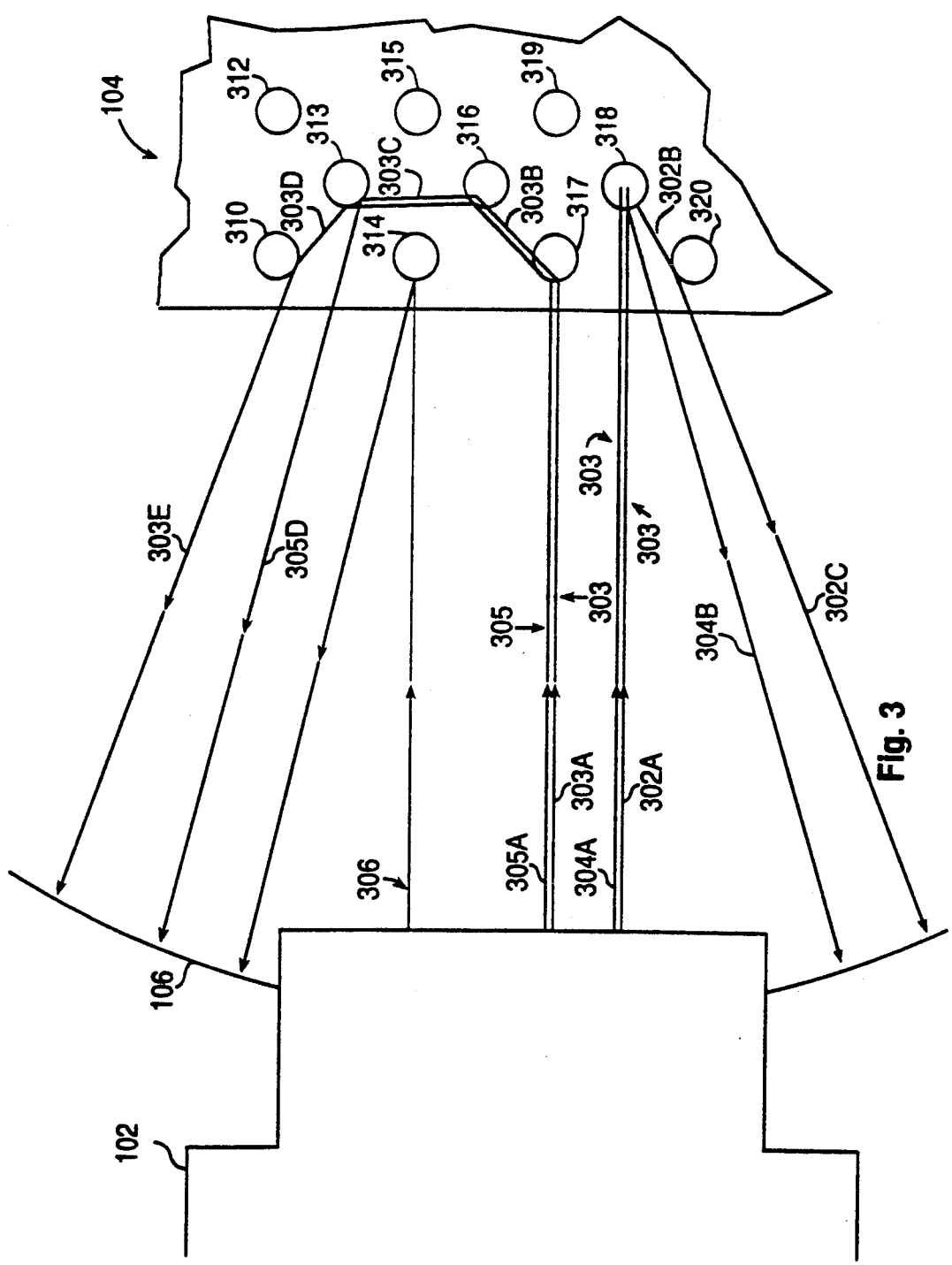
FIG. 3 shows representative paths of Kikuchi and Auger electrons created by directing a beam of electrons onto the surface of a sample.

Referring to FIG. 3, the surface of sample 104 is shown enlarged relative to electron source 102, and is comprised of atoms, representatively shown by 310, 312, 313, 314, 315, 316, 317, 318, 319 and 320. Sample 104 has both long range order and short range order. Long range order means that each localized electron source (the atom that emits the electron) may be found at regular positions throughout sample 104. Short range order means that each localized electron source will be surrounded by atoms in identical relative positions.

Two representative paths, 303 and 305, of a Kikuchi electron are shown. Path 303 may be described as follows: the incident electron on path 303A collides elastically with atom 317; the electron then follows path 303B to atom 316 where it undergoes another elastic collision; the electron then follows path 303C to atom 313 where it undergoes an inelastic collision; after colliding with atom 313 the electron (now a Kikuchi electron because it underwent an inelastic collision) follows path 303D and collides elastically with atom 310, then follows path 303E to detector 106. The Kikuchi electron that follows a path such as this, i.e. a path that includes an elastic collision after the last inelastic collision, forms part of the object wave.

Path 305 is a representative path of a Kikuchi electron that forms part of the reference wave. Path 305 is the same as path 303 up to the inelastic collision with atom 313. After the inelastic collision a Kikuchi electron forming part of the reference wave follows a path such as 305D and travels directly to detector 106.

The localized source, for both the reference wave and the object wave Kikuchi electrons, is the last atom with which the electron had an inelastic collision, in this case atom 313. For our purposes, a Kikuchi electron may be treated as if it actually originated at the last inelastic collision site because it loses its phase coherence with respect to other electrons during the collision.

Similarly, two representative paths, 302 and 304, of an Auger electron are shown. Path 302 is representative of the path taken by electrons forming the reference wave. An incident electron collides with atom 318, causing an Auger electron to be emitted. The Auger electron then follows path 302B to atom 320 where it undergoes an elastic collision. Following the elastic collision the electron follows path 302C to detector 106. An Auger electron that follows a path such as this, i.e. a path that includes an elastic collision after the emission of the Auger electron, forms part of the object wave. Atom 318 is the localized source of Auger electrons following path 302.

Path 304 is a representative path of an Auger electron that forms part of the reference wave. After the Auger electron is formed when the incident electron strikes atom 318, the Auger electron travels directly to the detector 106. Atom 318 is the localized source of Auger electrons following path 304.

Path 306 is representative of the path of electrons that do not engage in inelastic collisions. Electrons that do not collide inelastically are still coherent, and will form Bragg spots on the diffraction pattern. Since completely elastic electrons from a regular sample surface probably do not contain holographic information it is desirable to minimize the number of elastic electrons. It has been found that energies between 600 eV and 1100 eV reduce the proportion of purely elastic electrons.

From an interference pattern between the reference and object waves, which was formed by Kikuchi electrons originating from a large number of localized source atoms, such as atom 313, the environment of a single localized source atom 313 may be determined. The intensity of the Kikuchi pattern (i.e. the interference pattern between the object and reference waves) may be regarded as the incoherent superposition of the interference pattern from each localized source, due to the randomness of the phase of the Kikuchi electrons. However, because short range order exists for the atoms adjacent the localized source, the wavelets that emerge from each localized source, such as atom 313, and its surrounding atoms such as atoms 310 and 314, are identical to the wavelets that emerge from the other localized sources and their surrounding atoms, apart from a random phase factor. The random phase factor is caused by the thermal vibrations of the localized source. If the wavelets emerging from different localized sources are superposed to determine the total amplitude scattered in any particular direction, as they are at the detector, the localized sources, due to the randomness of their phases at the source, behave like a collection of incoherent scatterers, and the resulting Kikuchi diffraction pattern is the same as that from a single localized source, except for a uniform scaling factor. Thus, Kikuchi data generated from many localized sources may be interpreted as if the electrons were from a single localized source.

The above analysis is equally true for Auger electrons, or any other localized source electron. The superposition of many incoherent localized source electrons may be interpreted as if the electrons were from a single source.

To create an actual holographic image, the hologram (film) must be illuminated by reconstructing coherent radiation, conjugate to the coherent radiation originally used to created the hologram. According to one aspect of the present invention, data corresponding to a holographic image is created by multiplying the data representing the intensity at each point by a function corresponding to the amplitude distribution of a reconstructing coherent electron beam. When a spherical detector is used, the reconstructing radiation of the reconstruction stage is a spherical wave having an amplitude distribution converging on the center of the sphere of which the detector is part, and has the form:

$$A_{rec} = (exp[-ik\hat{k}\cdot r])/r, \qquad (1)$$

where r is a position vector having an origin at the center of the sphere on which the detector is located, and x is the unit vector in the direction the incident radiation is propagating. In cartesian coordinates the expression is:

$$A_{rec} = exp[-ikz(1-\hat{k}^2_x-\hat{k}^2_y)^{\frac{1}{2}}]exp[-ik(x\hat{k}_x+y\hat{k}_y)]\{(x^2+y^2+z^2)^{-\frac{1}{2}}\} \qquad (2)$$

where x and y are cartesian coordinates in the plane of the surface of sample 104, z is the cartesian coordinate that is parallel to the surface normal, i.e., parallel to the electron paths 302A, 303A, 304A, 306A and 307A, $\hat{k}_x$ is the component of $\hat{K}$ in the x direction, and $\hat{k}_y$ is the component of $\hat{k}$ in the y direction.

In the preferred exemplary embodiment the amplitude of the holographic image at points off of the hologram may be calculated using the Helmholtz-Kirchoff integral. The Helmholtz-Kirchoff integral, applied to the reconstructed hologram is given by:

$$A(r) = \int\int I(k,\hat{k})exp[-ik\hat{k}\cdot r]d\hat{k}_x d\hat{k}_y \qquad (3)$$

where I(k,k) is the diffraction pattern intensity distribution, i.e. a function having a value at each point equal to the value of the data collected at that point. As those skilled in the art will recognize other techniques may be used to reconstruct the holographic image.

Equation (3) may be performed numerically using a fast Fourier transform. I(k,k), which is the intensity of the interference pattern between the object and reference waves, is equal to:

$$(R+O)(R^*+O^*) \text{ or } R^*R+O^*O+R^*O+O^*R, \quad (4)$$

where R and R* represent the reference wave and its conjugate and O and O* represent the object wave and its conjugate. Both the reference and object waves are complex, as are all electron waves, according to quantum theory. The R*R term does not contain information about the interference of the reference and object waves, and the O*O term is negligible. Therefore, the integral of the amplitude of the hologram may be approximated by:

$$A(r) = \int\int [R^*O + O^*R] \exp[-ikz(1-\hat{k}^2_x-\hat{k}^2_y)^{\frac{1}{2}}] \exp[-ik(x\hat{k}_x+y\hat{k}_y)] \quad (5)$$

As one skilled in the art will recognize, equation (5) is a double Fourier integral of the intensity distribution [R*O+O*R] multiplied by the phase factor $\exp[-ikz(1-\hat{k}^2_x-\hat{k}^2_y)^{\frac{1}{2}}]$, where $\exp[-ik(x\hat{k}_x+y\hat{k}_y)]$ is part of the Fourier transform, and may be solved on a personal computer or other microprocessor using a fast Fourier transform routine, such as one found in *Numerical Recipes*, William Press et. al., Cambridge Press (1986). As those skilled in the art will recognize there are other methods to achieve the same result.

Figure 4:
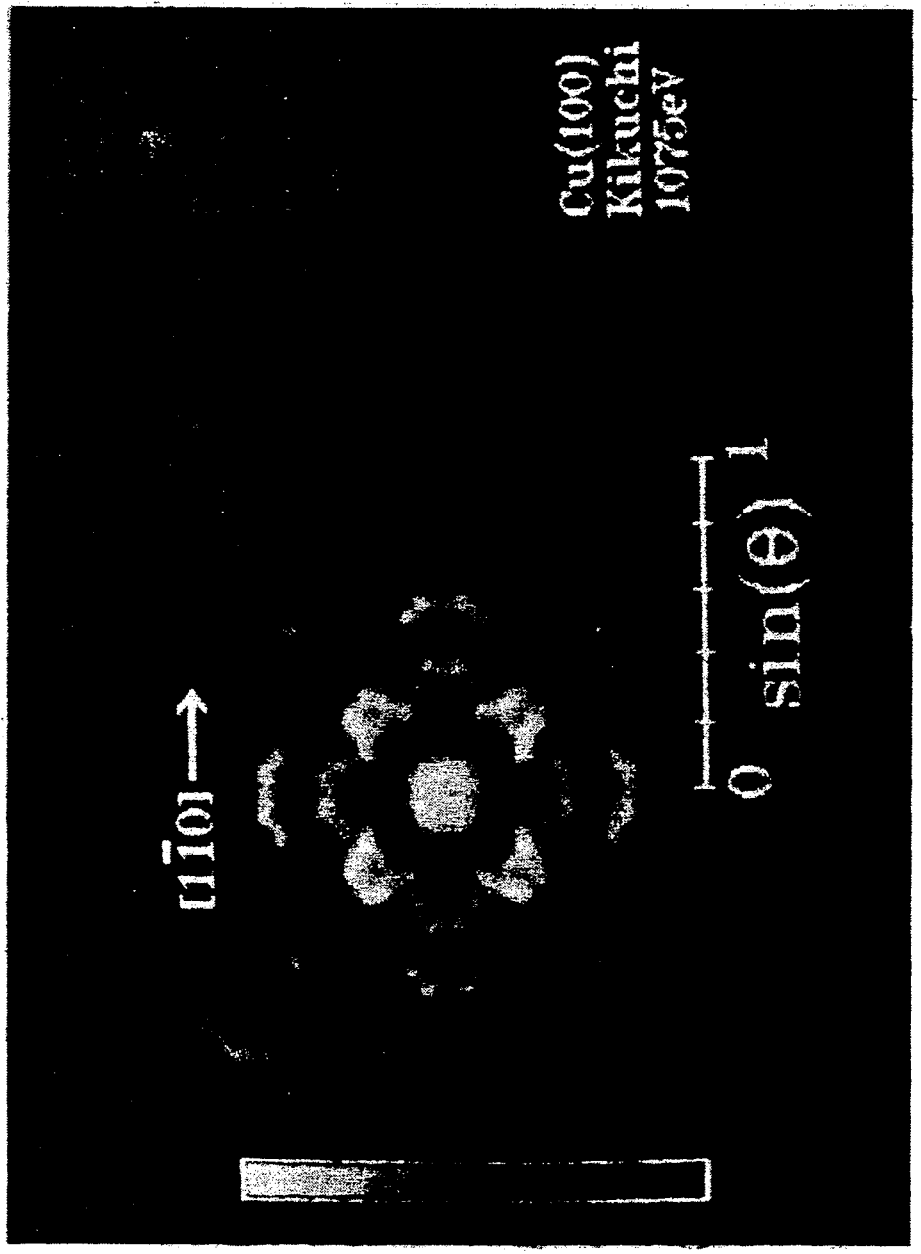
FIG. 4 is a photograph of a stereographic projection of a diffraction pattern formed by Kikuchi electrons.

FIG. 4 is a photograph showing a Kikuchi electron diffraction pattern. The measured Kikuchi pattern hologram (the detected diffraction pattern) was obtained at 1075 eV from Cu(001). The arrows show the orientation of the crystallographic axes.

Figure 5:
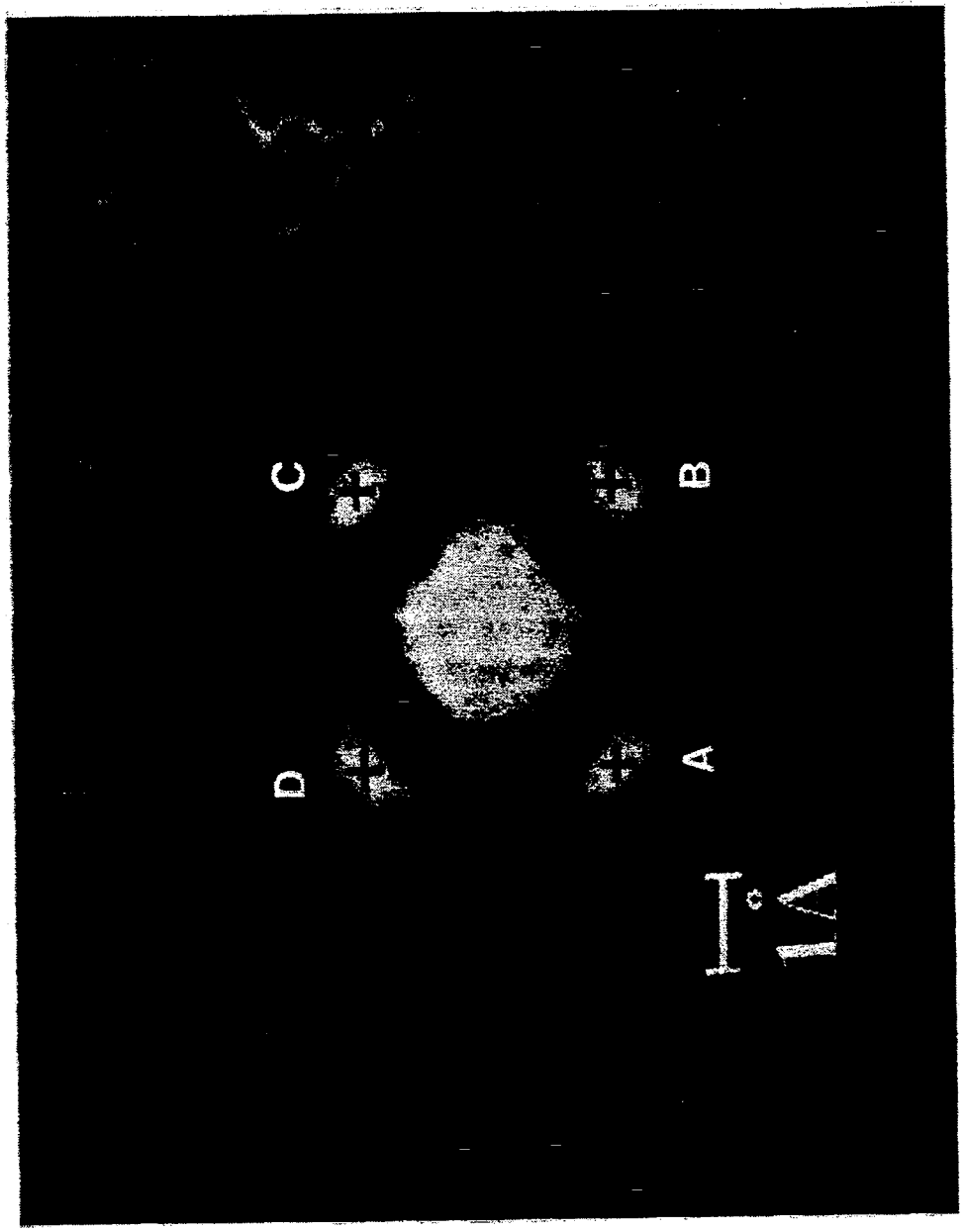
FIG. 5 is a photograph of a section of a first selected plane of a holographic image of the surface of a sample.
Figure 6:
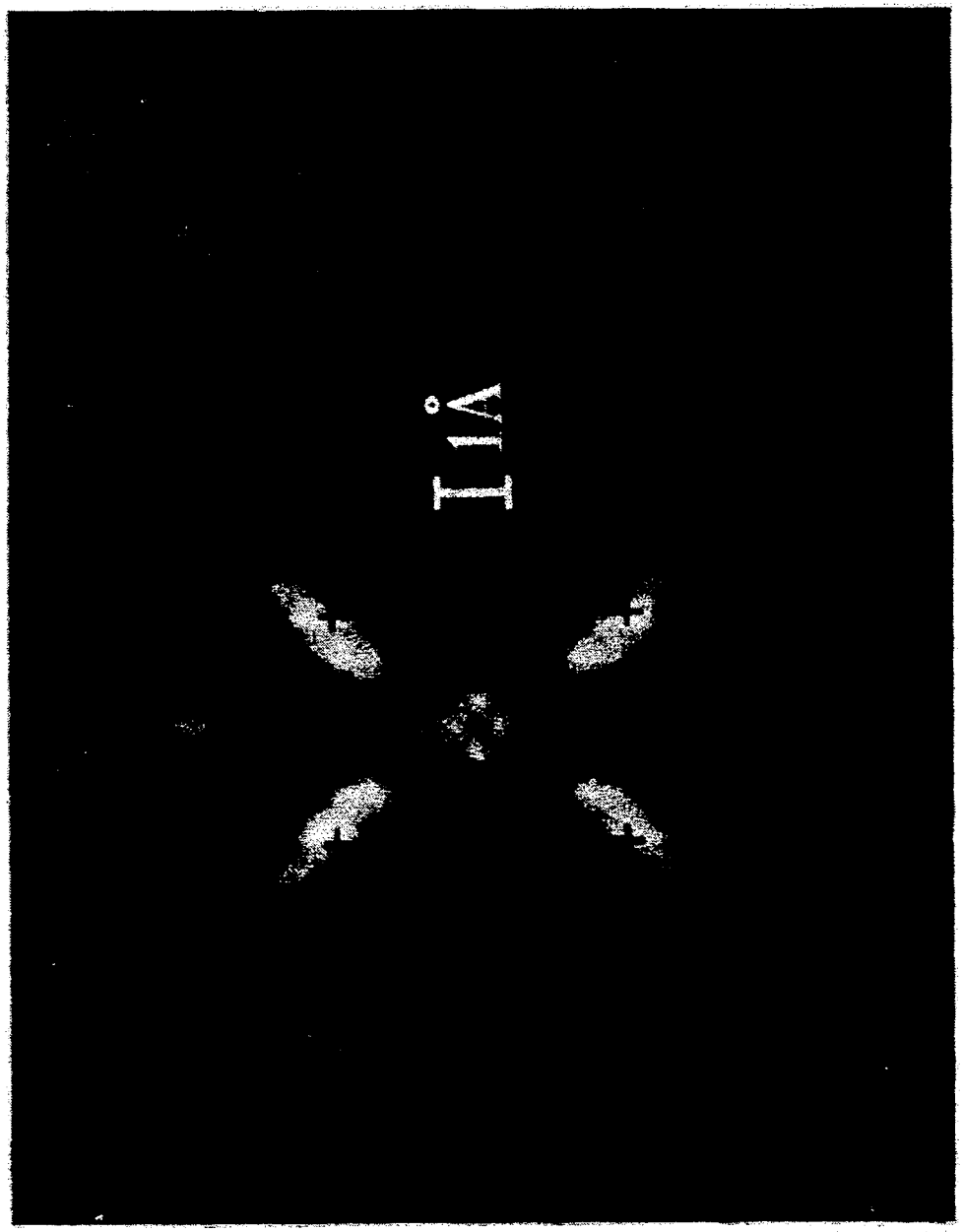
FIG. 6 is a photograph of a section of a second selected plane of a holographic image of atoms near the surface of a sample.

FIGS. 5 and 6 are photographs showing selected planes of the holographic image of the surface of the sample generated in accordance with the present invention. However, rather than creating the image as the measurement was being made, the data was stored and the image was generated later. The intensity in selected planes of the three dimensional image were then displayed on a computer, and the photographs of FIGS. 5 and 6 were made. FIG. 5 shows the holographic reconstruction of the hologram of FIG. 4, corresponding to a plane of atoms lying above the source atom. FIG. 6 shows the holographic reconstruction of the hologram of FIG. 4, corresponding to a plane perpendicular to the surface of the sample. The crosses in FIGS. 5 and 6 mark the positions of the atoms in an ideal crystal.

The terms of equation (4) which were neglected in equation (5) will to give rise to random spurious features, which may be eliminated or reduced by repeating the experiments for a variety of electron voltages.

A further embodiment of the present invention is an apparatus for the reconstruction of a holographic image of atoms near the surface of the sample. Referring to FIGS. 1, 2 and 3, the apparatus includes electron source 102, detector 106, camera 110, computer 112, and video display unit 114. Electron source 102, suitably an electron gun such as, for example a Varian Leed/Auger Model 981-2125, in the preferred exemplary embodiment, is capable of emitting substantially monochromatic electrons that are sufficiently collimated. The electrons emitted have energies suitably between about 600 and 1100 electron volts.

The electrons emitted by electron source 102 impinge on the surface of sample 104 and form a diffraction pattern at detector 106. Detector 106 is preferably spherical in shape such as, for example the 4-grid Leed optics Varian model 981-0127, and emits light having an intensity proportional to the intensity of the diffraction pattern at detector 106.

Camera 110 which may be, for example the Bosch T6YC 9A, records the intensity of the light emitted by detector 106, and provides as an output, an electrical signal corresponding to the light intensity. Thus, detector 106 and camera 110 cooperate to detect the intensity distribution of the diffraction pattern formed by the interference of reference and object waves, and provide an electrical signal corresponding to the detected intensity.

The output of camera 110 is provided to computer 112 which is capable of storing and manipulating the data. Specifically, computer 112, preferably a work station, such as, for example an IBM RISC System/6000 POWERstation, is capable of multiplying each data point of the detected intensity distribution by a function corresponding to the intensity of an illuminating wave and a phase factor from equation (5), to thereby generate a reconstructed holographic image.

Computer 112 is further capable of generating holographic image intensity data in three dimensions, by applying a fast Fourier transform, or other similar mathematical technique, to the reconstructed holographic image data. Image intensity data corresponding to a specific plane is then provided by computer 112 to video display unit 114, or similar device to allow the surface of the sample in the specific plane to be viewed.

Referring now to FIG. 3, modulator 202, such as a digital to analog convertor and programmable power source, and an energy filter, comprised of grids 204-208, such as the 4-grid Leed optics Varian model 981-0127, is provided to selectively allow lower energy electrons, such as Auger electrons, to be detected. Modulator 202 is also connected to computer 112 to allow the computer to differentiate between data including Auger electrons and data excluding Auger electrons.

It should be clear from the foregoing specification that modifications and changes may be made to the invention without departing from the scope of the claims.

We claim:

1. A method for imaging the atomic environment of a surface of a sample, comprising the steps of:

directing a beam against the sample surface to cause formation of a first diffraction pattern comprising a first plurality of electrons having a first energy level and a second plurality of electrons having a second energy level, said second energy level being greater than said first energy level;

forming a second diffraction pattern including said second plurality of electrons but not including said first plurality of electrons by selectively energy filtering said first plurality of electrons;

detecting the intensity distribution of said first diffraction pattern and calculating first numerical image intensity data corresponding to said intensity distribution of said first diffraction pattern;

detecting the intensity distribution of said second diffraction pattern and calculating second numerical image intensity data corresponding to said intensity distribution of said second diffraction pattern;

calculating third numerical image intensity data corresponding to the difference between said first numerical image intensity data and said second numerical image intensity data; and constructing the third numerical image intensity data to form an image indicating the position of a scatterer atom on said surface relative to an associated emitter atom on said surface.

2. The method of claim 1, in which said step of directing a beam includes the step of directing a beam of X-rays onto said surface.

3. The method of claim 1, in which said step of directing a beam further comprises directing a beam of electrons onto said surface.

4. The method of claim 3, in which said electron beam comprises electrons of an energy of about 600 eV to 1100 eV.

5. The method of claim 3 in which the step of directing a beam further comprises forming a Kikuchi electron diffraction pattern.

6. The method of claim 5, in which the first electrons comprise Auger electrons.

7. The method of claim 1, in which said step of constructing the data includes the step of applying a fast Fourier transform to said third numerical image intensity data.

8. The method of claim 7, in which the step of constructing the data includes the step of multiplying said third numerical intensity data by a function representing a converging spherical wave.

9. The method of claim 1, in which said first and second diffraction patterns are formed on a hemispherical detector screen.

10. The method of claim 1, in which the surface of said sample comprises atoms having long range order.

11. The method of claim 1, further comprising displaying said image on a visual display device.

12. The method of claim 11, wherein said image is displayed in real time.

13. An apparatus for imaging the atomic environment of the surface of a sample, comprising:

means for directing X-rays against said surface, which X-rays cause emitter atoms on said surface to emit electrons, some of which electrons scatter off of a scatterer atom near the associated emitter atom, thereby forming a diffraction pattern;

a detector disposed to detect said diffraction pattern;

means connected to said detector for generating numerical image intensity data corresponding to said diffraction pattern; and means for constructing the numerical image intensity data to form an image indicating the location of a scatterer atom on said surface relative to an associated emitter atom on said surface.

14. The apparatus of claim 13, in which said detector includes a hemispherical detector screen.

15. The apparatus of claim 14, in which said constructing means includes means for multiplying said numerical image intensity data by a function representing a converging spherical wave and a phase factor.

16. The apparatus of claim 15, in which said constructing means further includes means for performing a fast Fourier transform on said numerical image intensity data.

17. The apparatus of claim 13, further comprising a display device operatively connected to said constructing means, which display device can display said image in real time.

18. An apparatus for the imaging of the atomic environment of a sample surface, comprising:

beam generator means for generating a beam that causes formation of a first electron diffraction pattern when the beam is directed against the sample surface;

a detector disposed to detect diffraction patterns from said sample created by the beam generator means;

a selectively operable filtering system including filter means for preventing electrons from the sample having energies below a predetermined level from reaching the detector to thereby form a second electron diffraction pattern;

means connected to said detector for calculating first numerical image intensity data corresponding to the intensity distribution of said first diffraction pattern as measured by said detector, calculating second numerical image intensity data corresponding to the intensity distribution of said second diffraction pattern as measured by said detector, and for calculating third numerical image intensity data corresponding to the diffraction between said first numerical image intensity data and said second numerical image intensity data; and means for constructing the third numerical image data to form an image indicating the position of a scatterer atom on said surface relative to an associated emitter atom on said surface.

19. The apparatus of claim 18, wherein the beam generator means generates an electron beam.

20. The apparatus of claim 19, wherein said beam generator means is capable of generating an electron beam having electrons of an energy in the range of about 600 eV to 1100 eV.

21. The apparatus of claim 18, wherein the beam generator means generates an X-ray beam.

22. The apparatus of claim 18, wherein the detector includes a hemispherical detector screen.

23. The apparatus of claim 18, in which said constructing means includes means for multiplying said third numerical image data by a function representing a converging spherical wave and a phase factor.

24. The apparatus of claim 23, in which said constructing means further includes means for performing a fast Fourier transform on said third numerical image data signal.

25. The apparatus of claim 18, further comprising a display device operatively connected to said constructing means, which display device can display said image in real time.

26. The apparatus of claim 18, wherein the filter means further comprises modulator means connected to the filter means for alternately energizing and deenergizing the filter means so that the detector alternately measures said first and second diffraction patterns.

27. A method for the imaging of the atomic environment of substrate atoms in a sample surface, comprising:

directing a beam against the sample surface to cause formation of an electron diffraction pattern, wherein the sample surface is composed of atoms having long range order;

measuring the intensity of the diffraction pattern from said sample surface;

generating numerical image intensity data corresponding to said diffraction pattern; and constructing the numerical image intensity data to form an image of the location of a scatterer substrate atom relative to an associated emitter substrate atom.

28. The method of claim 27, wherein the beam is an electron beam.

29. The method of claim 27, wherein the beam is an X-ray beam.

30. The method of claim 27, further comprising displaying said image on a display device.

31. The method of claim 30, wherein said image is displayed in real time.

* * * * *